United States Patent [19]

Vachenauer

[11] 4,090,150
[45] May 16, 1978

[54] HIGH DYNAMIC PHASE-ACCURATE ALTERNATING VOLTAGE AMPLIFIER OPERATING AS A LOGARITHMIC AMPLIFIER FOR MAINTAINING AMPLITUDE INFORMATION

[75] Inventor: Erwin Vachenauer, Haar, Germany

[73] Assignee: Siemens Aktiengesellschaft, Berlin & Munich, Germany

[21] Appl. No.: 761,645

[22] Filed: Jan. 24, 1977

[30] Foreign Application Priority Data

Feb. 17, 1976 Germany .............................. 2606270

[51] Int. Cl.² ............................................. H03F 3/04
[52] U.S. Cl. ..................................... 330/302; 328/145; 330/293; 330/294; 330/310
[58] Field of Search ........................ 307/237; 328/145; 330/293, 294, 302, 310

[56] References Cited

U.S. PATENT DOCUMENTS

| | | | |
|---|---|---|---|
| 3,319,176 | 5/1967 | Guisinger | 307/237 X |
| 3,403,347 | 9/1968 | Stull, Jr. | 328/145 X |
| 3,605,027 | 9/1971 | Nichols | 328/145 |
| 3,717,820 | 2/1973 | Garcia et al. | 330/21 |

*Primary Examiner*—Lawrence J. Dahl
*Attorney, Agent, or Firm*—Hill, Gross, Simpson, Van Santen, Steadman, Chiara & Simpson

[57] ABSTRACT

An amplifier circuit for the unadulterated transmission of phase information of a supplied ac voltage signal over a large dynamic range includes a series connection of a series of similar amplifier stages each of which is followed by a symmetrical limiter. The amplifier operates as a logarithmic amplifier for maintaining the amplitude information of the supplied ac signal. Each of the amplifier stages comprise an emitter-base transistor amplifier circuit having negative feedback and an output circuit which contains a resonant circuit which is strongly damped by an attenuating resistor and whose capacitance is formed by a trimmer capacitor connected in parallel to a pair of diodes. The diodes are connected in anti-parallel relation to one another and represent the limiter. The capacitance is adjustable for purpose of impedance adjustment and is set in such a manner that the resultant resonant circuit impedance is capacitive.

4 Claims, 5 Drawing Figures

HIGH DYNAMIC PHASE-ACCURATE ALTERNATING VOLTAGE AMPLIFIER OPERATING AS A LOGARITHMIC AMPLIFIER FOR MAINTAINING AMPLITUDE INFORMATION

BACKGROUND OF THE INVENTION

1. Field of the Invention

This invention relates to an amplifier circuit for the unadulterated transmission of phase information of a supplied ac voltage signal over a large dynamic range.

2. Description of the Prior Art

The allowed German application No. 2,439,612 discloses a process for the amplitude measurement of pulses which have considerable differences in level and in which the pulses are fed to an attenuation element which can be set up electronically in stages, and thereafter to a rectifier, and where the pulses are fed to a control circuit, which, whenever a specific positive or negative threshold voltage of a pulse is overshot, sets the next higher attenuation stage of the attenuation element. The rectified pulses are fed to a maximum value detector which, on reaching a positive or negative pulse maximum for analysis pulses, on the one hand, switches through a signal level value derived from the setting of the attenuation element and, on the other hand, switches through the established maximum value for interpolation in the range between the set attenuation stage and the attenuation stage of the attenuation element which is no longer reached.

Assuming equivalence of attenuation element and amplifier, the aforementioned publication discloses a possibility of phase-accurate ac voltage amplification over a large dynamic range, in which a switching amplifier is used by which automatic, stepped reduction of its amplifiers is always set in such a manner that it is not overmodulated. However, here a distortion-free transmission of the phase information of ac voltage signals is possible only when the amplifier operates in the linear portion of its amplification curve.

SUMMARY OF THE INVENTION

The object of the invention is to provide a high-dynamic ac voltage amplifier which is suitable for transmission, the transmission being unadulterated in phase, and which does not require any switchover of the amplification stage and in which the curve linearity does not require observation with such accuracy.

According to the invention, the realization of the foregoing object is provided by a series connection of a series of similar amplifier stages, each of which is followed by a symmetrical limiter. It is of essential significance that the output signal of each amplifier stage is limited not asymmetrically, but symmetrically, as only then is there no shift in the axis of symmetry and thus in the zero transitions of the ac voltage signal.

The individual amplifier stages advantageously comprise, in each case, an emitter-base transistor amplifier circuit which is provided with negative feedback and which has an output circuit which includes a resonant circuit, the resonant circuit being heavily attenuated by an attenuating resistor. The resonant circuit includes a capacitance which is formed by a trimmer capacitor connected in parallel to a pair of diodes which are connected anti-parallel to one another and represent the limiter. The adjustable capacitor serves for impedance compensation in such a manner that the resultant resonant circuit impedance is capacitive. With the aid of the trimmer capacitor, the phase transmission characteristics of an amplifier stage having a subsequently connected limiter can be optimized in dependence upon the input level.

The amplifier circuit according to the present invention can also be used in a device for the phase and amplitude measurement of pulse-modulated ac voltage signals, in particular high frequency or intermediate frequency signals having large level differences.

A further development of the invention, in association with the amplitude measurement, is that at the input and after each limiter which is connected at the output of the individual amplifier stages, the ac voltage signal occurring is branched off in a load-free fashion and is, in each case, fed to a rectifier. The rectified signals are input into an adder so that, at least approximately, an output voltage corresponding to the logarithmic of the ac voltage supplied to the amplifier stages at the input arises at the output of the adder. As a result of this measure, the item of amplitude information which is lost as a result of a limiting amplifier is regained. The conformity of the characteristic curve with a logarithm characteristic is the greater, the higher the number of amplifier stages. Under the condition of a given overall amplification corresponding approximately to the dynamic range, the number of amplifier stages having subsequently connected symmetrical limiters can advantageously be increased in that the amplification of the individual amplifier stages is reduced and, thus, additional stages are introduced. This also additionally improves the phase behavior, as then the maximum voltage connected to the limiter diodes is reduced.

More specific details of the invention will be provided in the following while making reference to an intermediate frequency amplifier which is used in a locating system. With the aid of a receiver multiple it is to be possible to determine the direction of incoming, pulse-modulated high frequency signals. In order to accomplish this, receivers are required which contain an intermediate frequency amplifier for a high dynamic range which is suitable for accurate phase and amplitude transmission. The items of phase and amplitude information present at the output of the intermediate frequency amplifiers are measured at a time located at the leading edge of the pulse-modulated signal, and are supplied as data material to a computer from which the latter determines the direction from which the high frequency signal have arrived. Therefore, one of the objects of the intermediate frequency amplifier is, in such a receiver, to transmit the phase information of the output signal unadulterated in a very wide dynamic range.

BRIEF DESCRIPTION OF THE DRAWINGS

Other objects, features and advantages of the invention, its organization, construction and operation will be best understood from the following description taken in conjunction with the accompanying drawings, on which.

DESCRIPTION OF THE PREFERRED EMBODIMENTS

Figure 1:
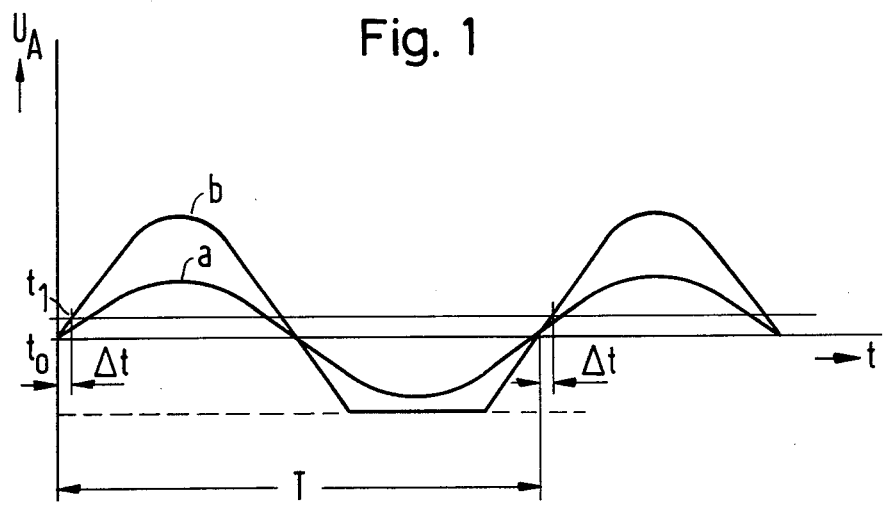
FIG. 1 is a graphic illustration of the phase shift of a signal as a result of an asymmetrical limitation.

First of all, an amplifier stage will be considered which, when operated with a small input voltage, supplies an undistorted, sinusoidal output voltage. This is illustrated by the curve a in FIG. 1. If the input level is increased, finally one reaches the level at which the amplifier distorts the output voltage (curve b of FIG. 1). This level marks the end of the linear relationship between the output and input voltages. The one-sided limitation of the sinusoidal voltage curve, which has been assumed to have been effected in this example, produces a dc voltage which can be considered as a new reference line.

This results in a shift of the zero transitions. The curve a begins at the time $t_o$, and the curve b begins at the time $t_1$. Therefore, a time shift of $\Delta t = t_1 - t_o$ occurs; the corresponding phase shift is then $\Delta \phi = (2\pi/T) \cdot (t_1 - t_0)$, where $T$ is the period duration of the sinusoidal curve. Phase-distortion-free transmission of sinusoidal signals is therefore only possible when the amplifier operates in the linear portion of its amplification curve, or when the output signal is symmetrically limited, since then there is no shift in the axis of symmetry and thus in the zero transitions.

The symmetrical limitation is therefore a basic condition for the limiter-amplifier.

Figure 2:
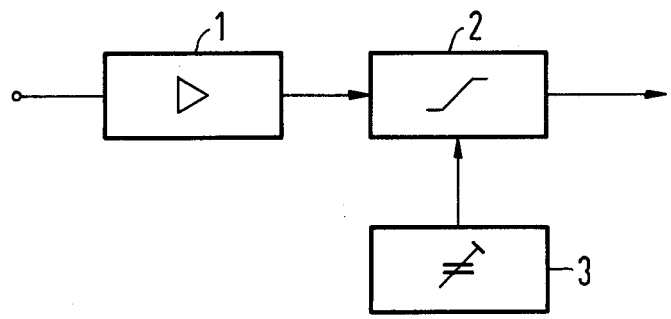
FIG. 2 is a block circuit diagram of a unit stage, comprising an amplifier stage and a subsequently connected limiter.

FIG. 2 illustrates a single amplifier stage 1 having a subsequently connected limiter 2 and having an impedance adjustment device 3 in the form of a block circuit diagram. The limiter 2 operates symmetrically. By means of the impedance adjustment device 3, the resultant resonant circuit impedance of the amplifier 1 is adjusted, taken into account the circuit elements of the limiter 3, in such a manner that it is capacitive.

Figure 3:
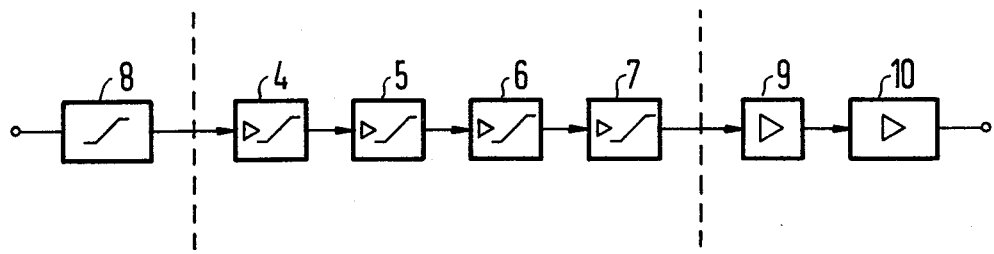
FIG. 3 is a block circuit diagram of an overall intermediate frequency amplifier having unit stages corresponding to FIG. 2.

FIG. 3 illustrates, in a block circuit diagram, an intermediate frequency amplifier constructed in accordance with the invention, with which the amplitude of the received signal which has been converted to an intermediate frequency of 4 MHz is amplified by 70 dB. From a specific input level onward, the signal is symmetrically limited and the phase information is transmitted unadulterated in a large dynamic range. To this end, four unit stages 4, 5, 6 and 7 illustrated in FIG. 2 are connected in series, each individual unit stage exhibiting an amplifier stage with an amplification of 17 dB, so that an overall amplification of approximately 70 dB occurs. A limiter 8 connected at the input becomes effective at high input levels, whereas an amplifier 9 having an amplification of approximately 6 dB supplies a fundamental amplification. The amplifier 9 is also followed by an emitter follower 10. The output signal phase at the emitter follower 10 can be measured for example by zero-transit comparison with a reference signal (U.S. Pat. No. 2,370,692).

Figure 4:
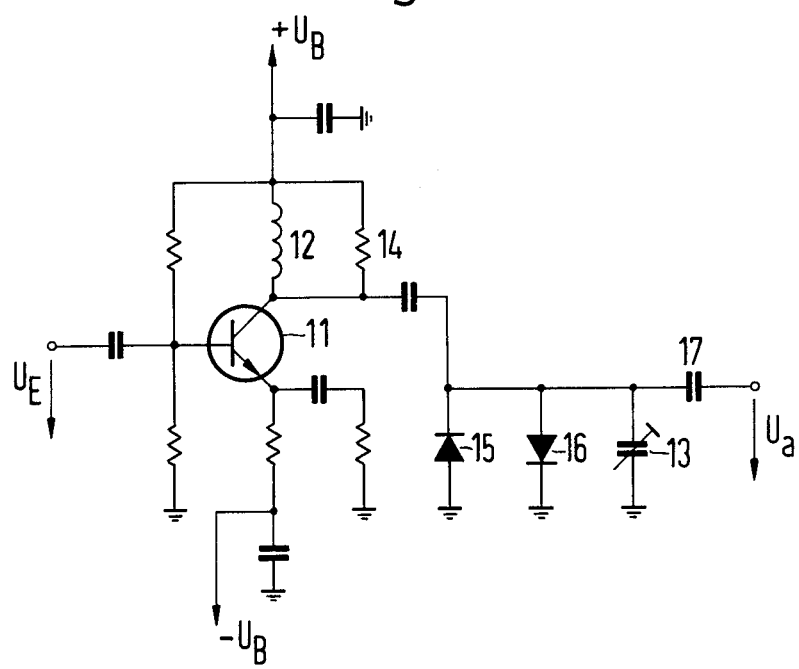
FIG. 4 is a schematic circuit diagram of a unit stage of the type illustrated in FIG. 2 shown in detail.

The circuit diagram of a unit stage shown in FIG. 2 can be seen in detail in FIG. 4. The amplifier stage comprises an emitter-base transistor amplifier stage having negative feedback. An input voltage $U_E$ is connected to the base of the transistor 11 which is operated on dc voltage with the operating voltage 2 $U_B$. In the output circuit of the transistor 11 is connected an inductance 12, a trimmer capacitor 13 and a resistor 14, which together form a heavily damped resonant circuit for the middle frequency of 4 MHz. Connected in parallel to the trimmer capacitor 13 are two oppositely connected diodes 15 and 16 to limit the positive and negative half waves. The trimmer capacitor 13 serves for impedance adjustment. The heavily damped parallel resonant circuit, comprising the resistor 14, the inductance 12 and the trimmer capacitor 13 is tuned in such a manner that the resultant cyclic impedance, taken into account the electric properties of the two limiter diodes 15 and 16, is capacitive. In this manner it is possible to optimize the phase transmission characteristics of the unit stage in dependence upon the input level. An output voltage $U_a$ is taken off by way of a coupling capacitor 17 which is connected to the diodes 15 and 16 and to the trimmer capacitor 13.

Figure 5:
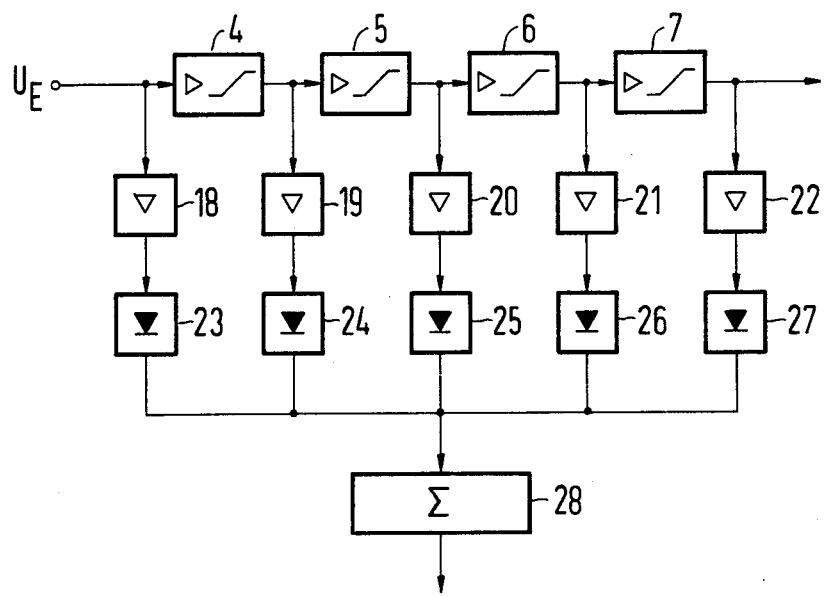
FIG. 5 illustrates an extended circuit diagram for the additional acquisition of amplitude information.

However, in a limiting amplifier, the amplitude information of the input signal is lost. This information can be regained, however, in that the circuit is extended to form a logarithmic amplifier operating in accordance with the principle of stepped rectification. FIG. 5 is a block circuit diagram of an extended circuit for regaining the amplitude information in addition to the phase information. At five points of the amplifier chain comprising the four unit stages 4, 5, 6 and 7, the intermediate frequency signal is branched off in as load-free fashion as possible, and is, in each case, amplified in the respective buffer amplifiers 18, 19, 20, 21 and 22, is then, in each case, rectified in one of the rectifiers 23, 24, 25, 26 and 27, and is finally fed to an adder 28. The output voltage of the adder 28 corresponds approximately to the logarithm of the intermediate frequency input voltage $U_E$. The conformity of the characteristic curve with a logarithm characteristic is greater with a greater number of unit stages. It could be increased, for example, in that the amplification of the unit stages is reduced and additional stages are introduced. This would also further improve the phase course as then the maximum voltage connected to the limiter diodes is reduced. The output signal voltage amplitude at the adder 28 can be measured e.g. by a known valve voltmeter operating with peak detection and actuated at the measuring moment. Phase measurement can be realized in the manner described in connection with FIG. 3.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as reasonably and properly be included within the scope of my contribution to the art.

I claim:

1. A multi-stage limiter amplifier for amplifying an ac voltage of a specific frequency which may have been subjected to large level fluctuations, comprising:

a plurality of serially-connected amplifier stages each including a feedback amplifier and a pair of limiter diodes connected to the output of said feedback amplifier, said diodes connected in opposite polarity and in parallel and having a symmetrical limiting effect, each of said amplifier stages including a transistor amplifier circuit comprising an output circuit including a parallel resonant circuit, a damping impedance strongly damping said parallel resonant circuit, said parallel resonant circuit including a trimmer capacitor connected in parallel to said limiter diodes for rendering said impedance capacitive.

2. The amplifier of claim 1, comprising:
a plurality of rectifiers connected to the limiter diodes at the outputs of said amplifier stages; and
adding means connected to said rectifiers for providing an output signal which is at least approximately the logarithmic of the signals received by said amplifier stages.

3. The amplifier of claim 2, comprising:
a plurality of buffer amplifiers, each of said buffer amplifiers connected between said amplifier stages and said adding means.

4. The amplifier of claim 2, wherein:
the amplification of each of said amplifier stages is small compared to the total required amplification thereby requiring a larger number of said amplifier stages for more accurate conformity to a logarithmic characteristic.

* * * * *